(12) United States Patent
Habara et al.

(10) Patent No.: US 12,416,695 B2
(45) Date of Patent: Sep. 16, 2025

(54) HIGH-FREQUENCY COIL UNIT AND MAGNETIC RESONANCE IMAGING APPARATUS

(71) Applicant: FUJIFILM Healthcare Corporation, Chiba (JP)

(72) Inventors: Hideta Habara, Chiba (JP); Shinichiro Suzuki, Chiba (JP); Yukinobu Imamura, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 188 days.

(21) Appl. No.: 18/498,074

(22) Filed: Oct. 31, 2023

(65) Prior Publication Data

US 2024/0151790 A1 May 9, 2024

(30) Foreign Application Priority Data

Nov. 8, 2022 (JP) .................... 2022-179106

(51) Int. Cl.
*G01R 33/34* (2006.01)
*G01R 33/421* (2006.01)
*H01F 27/28* (2006.01)

(52) U.S. Cl.
CPC ......... *G01R 33/34* (2013.01); *G01R 33/4215* (2013.01); *H01F 27/2885* (2013.01)

(58) Field of Classification Search
CPC .. G01R 33/34; G01R 33/4215; G01R 33/422; G01R 33/34076; H01F 27/2885
See application file for complete search history.

(56) References Cited

U.S. PATENT DOCUMENTS

| 5,367,261 A | 11/1994 | Frederick |
| 5,574,372 A | 11/1996 | Moritz et al. |
| 6,232,548 B1 | 5/2001 | Eberler et al. |
| 10,168,400 B2* | 1/2019 | Tomiha ............ G01R 33/34076 |
| 2016/0091576 A1 | 3/2016 | Tomiha et al. |

OTHER PUBLICATIONS

"Search Report of Europe Counterpart Application", issued on Mar. 14, 2024, pp. 1-10.

* cited by examiner

*Primary Examiner* — G.M. A Hyder
(74) *Attorney, Agent, or Firm* — JCIPRNET

(57) ABSTRACT

Provided is an RF shield that achieves a balance between an improved irradiation efficiency and suppression of eddy current-induced heat by a gradient magnetic field coil, while avoiding complexity of conductor pattern design for suppressing an eddy current by the gradient magnetic field coil. A cylindrical RF shield, which is one of elements constituting a high-frequency coil unit, is formed by rolling patterned conductive thin films formed on both front and back surfaces of an insulating sheet, front and back patterns of the patterned conductive thin film are mirror-symmetrical in a central axis direction of a cylinder, the front pattern is divided into two in the central axis direction, one side of two divided patterns is further divided into two in a circumferential direction, each of three independent pattern islands has slits such that strips are formed along to the cylinder axis direction, and each of the strips has a portion connected in an up-down direction at one location.

9 Claims, 12 Drawing Sheets

HIGH-FREQUENCY COIL UNIT AND MAGNETIC RESONANCE IMAGING APPARATUS

INCORPORATION BY REFERENCE

The present application claims priority from Japanese patent application JP 2022-179106 filed on Nov. 8, 2022, the content of which is hereby incorporated by reference into this application.

BACKGROUND OF THE INVENTION

1. Field of the Invention

The present invention relates to a high-frequency coil unit used in a magnetic resonance imaging apparatus, and more particularly, to an RF shield provided in the high-frequency coil unit.

2. Description of the Related Art

In a magnetic resonance imaging apparatus (hereinafter, referred to as an "MRI apparatus"), a subject disposed in a uniform static magnetic field generated by a static magnetic field magnet is irradiated with a high-frequency signal (hereinafter, a "radio frequency (RF) signal"), which is an electromagnetic wave, and nuclear spins within the subject are excited, and a nuclear magnetic resonance (NMR) signal, which is an electromagnetic wave generated by the nuclear spins, is received and subjected to signal processing, whereby a magnetic resonance image of the subject is acquired.

The irradiation of the RF signal and the reception of the NMR signal are performed by an antenna device such as an RF antenna or an RF coil that transmits or receives electromagnetic waves having a radio frequency. As such an antenna device, a high-frequency coil unit using a birdcage-type coil is known.

The commonly used birdcage-type coil includes two circular ring conductors serving as end-rings, and a plurality of linear rung (crossbar) conductors connecting these two ring conductors, as well as capacitors, diodes, power feeding cables (not shown), and the like, and is configured such that the capacitors are inserted into gaps provided at the ring conductor in equal intervals and the diodes are inserted into gaps of the rung conductors.

Such a cylindrical birdcage-type coil is usually encompassed by a cylindrical conductor called an RF shield, and the capacitors provided in the birdcage-type coil are adjusted depending on sizes and placements of RF shield, the rung conductors, and the ring conductors to resonate at a specific frequency of the MM apparatus. The birdcage-type coil has a feature that a spatial uniformity of an RF magnetic field (also referred to as an "irradiation magnetic field") generated by the emitted RF signal is better than that of simple loop coils or saddle (saddle-type) coils. Due to this feature, the birdcage-type coil becomes the standard type of a transmission coil in a tunnel-type horizontal magnetic field MRI apparatus in the current days.

In the horizontal magnetic field MRI apparatus, a cylindrical gradient magnetic field coil, that applies a magnetic field gradient to a magnetic field, is usually formed into a cylindrical shape. And the RF shield of the birdcage-type coil is often installed on an inner cylindrical surface of the cylindrical gradient magnetic field coil.

One of the important requirements of such an RF shield is having a high electrical conductivity as much as possible at the RF frequency, for example, about 64 MHz for a 1.5 Tesla MRI apparatus, and another one is ensuring that, the RF shield does not excessively generate heat or become prone to ignition due to an induced eddy current caused by the magnetic field of the frequency region of several kHz generated by the gradient magnetic field coil. However, for example, using a copper thin film having excellent electrical conductivity as the RF shield poses a problem such as heat generation and melting of insulating material due to the eddy current, and it is important to satisfy both the above-described two requirements.

In order to meet the two requirements, there is a method of using copper foils on both surfaces of the insulating sheet and forming a tiled pattern to connect the front surface and the back surface as a capacitor to ensure that there is nearly no resistance near 64 MHz but the eddy current is induced only within a single tile (U.S. Pat. Nos. 5,367,261A and 5,574,372A). This method is called the tiling method.

For example, in the pattern of the RF shield disclosed in U.S. Pat. No. 5,574,372A, it is described that tiles are overlapped between the front and back surfaces in a staggered manner along a circumferential direction. However, in this pattern, there is no DC connection portion in the circumferential direction at a location close to a portion corresponding to the ring portion of the birdcage-type coil, and therefore, the Q value of the birdcage-type coil drops, therefore it is difficult to put into practical use. Even in a case where the pattern of the RF shield disclosed in U.S. Pat. No. 5,574,372A has the connection portion in the circumferential direction, slits in a direction perpendicular to the cylinder axis are not provided. Therefore, it cannot counteract the eddy currents generated by the gradient magnetic fields of X, Y, and Z, and it is insufficient to suppress heat generation due to the eddy current.

On the other hand, in the RF coil disclosed in U.S. Pat. No. 5,367,261A, a configuration is employed as shown in FIGS. 9A and 9B. The RF shield copper foil patterns which are formed on both surfaces in a tiled manner are divided into regions 192 and 194 on both sides in an axial direction of a cylinder and a region (central region) 184 between the regions, and the regions on both sides have tiles (strips) 185 whose longitudinal directions are arranged in the circumferential direction, and the central region 184 has tiles whose longitudinal directions are arranged in the axial direction of the cylinder. FIGS. 9A and 9B show a pattern on the front side (FIG. 9A) and a pattern on the back side (FIG. 9B), but the description of the pattern on the back side will be omitted. With such a configuration of the RF shield, currents flow along the ring conductors of the birdcage-type coil in the regions 192 and 194 on both sides, currents flow along the rung conductors of the birdcage-type coil in the central region 184, and a high electrical conductivity is maintained while restricting the generation area of the eddy current to within the tile.

SUMMARY OF THE INVENTION

The magnitude of the eddy current generated on the RF shield by the magnetic field generated by the gradient magnetic field coil is proportional to the magnetic field intensity generated by the gradient magnetic field coil. The gradient magnetic field coil consists of three sets of gradient magnetic field coils that generate gradient magnetic fields in three axial directions, that is, an X-direction, a Y-direction, and a Z-direction, and the cylindrical gradient magnetic field coil has a structure in which these three sets of gradient magnetic field coils are overlapped in a thickness direction of the cylinder. Therefore, the eddy current generated in the RF shield is most affected by the gradient magnetic field coil disposed on an innermost side of the cylinder, that is, the gradient magnetic field coil located closest to the RF shield, among the three sets of gradient magnetic field coils. For example, in the gradient magnetic field coil shown in FIG. 8, an elliptical pattern of an X-direction gradient magnetic field coil (402) is located closest to the RF shield and is disposed on the left and right sides in FIG. 8. Usually, a location where the strongest magnetic field generated by the X-direction gradient magnetic field coil exists is near the center portion of the left and right elliptical patterns (a position indicated by a thick alternating long and short dash line). That is, the magnetic field generated by the gradient magnetic field coil is strong at a distance D502 from the magnetic field center of the cylinder axis.

In the RF shield described in U.S. Pat. No. 5,367,261A, although patterns are formed in a tiled manner along the circumferential direction in the regions on both sides along the axial direction of the cylinder, it is necessary to design the patterns of the RF shield by changing the width of the tiles in order to suppress the generation of the eddy current as much at a position where the magnetic field generated by the gradient magnetic field coil is strongest, that is, at a distance D502 of FIG. 8 from the magnetic field center. In an attempt to reduce the eddy current by taking into account of the position of the gradient magnetic field coil in the RF shield described in U.S. Pat. No. 5,367,261A, the pattern becomes complicated, which makes it difficult to design. In particular, the determination of the tile width requires numerous factors that should be verified by both experimental and computational methods, and significant efforts are required.

The present invention has been made in view of the above-described circumstances, and an object of the present invention is to provide an RF shield of a birdcage-type irradiation coil having a relatively simply designable RF shield pattern capable of maintaining an irradiation efficiency while preventing heat generation due to an eddy current.

In order to achieve the above-described object, in a high-frequency coil unit of the present invention, the pattern of the RF shield has the following features. There is a provided RF shield in which sheets provided with conductive thin film patterns on both surfaces of an insulator are formed into a cylindrical shape, in which in order to prevent heat generation due to an eddy current, the RF shield is configured such that strip-shaped patterns are formed on the front and back conductive thin films, where the strips are disposed in an axial direction of a cylinder, and the front and back strips overlap in a staggered manner at both ends in the axial direction of the cylinder. In addition, a portion corresponding to a ring conductor of the RF coil is made such that strips are connected to minimize the cut portions where mirror currents of the ring conductor flow in order to ensure a high electrical conductivity at the RF frequency and to ensure capacitance as a capacitor between strips.

According to the present invention, there is provided a high-frequency coil unit including: a cylindrical RF coil including ring conductors disposed at both ends and a plurality of rung conductors connecting the ring conductors provided at both ends; and a cylindrical RF shield disposed to cover an outer periphery of the RF coil, in which the RF shield has an insulating sheet and conductor patterns formed on the front surface and the back surface of the insulating sheet. The conductor patterns are each divided into the first and the second conductor regions with different length in an axial direction of a cylinder, each of the conductor regions includes a plurality of strips that have a connection portion which is provided at least one location in the axial direction of the cylinder and the connecting portion extends along a circumferential direction of the cylinder and the strips are partially separated by a plurality of slits partially formed along the axial direction of the cylinder, the connection portion along the circumferential direction of the cylinder is cut at at least one location within one circumference of the cylinder, and a position of a cut portion thereof is shifted (not at the same position) in the circumferential direction in the front surface and the back surface of the insulating sheet.

The conductor pattern of the front surface and the conductor pattern of the back surface are disposed such that the first conductor region of one and the second conductor region of the other overlap, and the slit of the conductor pattern of the front surface and the slit of the conductor pattern of the back surface are shifted from each other in the circumferential direction in an overlapping portion between the first conductor region and the second conductor region.

It is possible to provide an RF shield for a birdcage-type irradiation coil that does not reduce an efficiency of the irradiation coil, generates less heat due to an eddy current caused by a gradient magnetic field, and reduces required design workload, thereby obtaining a high-frequency coil unit with excellent irradiation efficiency and durability.

DESCRIPTION OF THE PREFERRED EMBODIMENTS

Hereinafter, a high-frequency coil unit according to an embodiment of the present invention and an MRI apparatus to which the high-frequency coil unit is applied will be described with reference to the drawings.

Overall Configuration of MRI Apparatus

Figure 1:
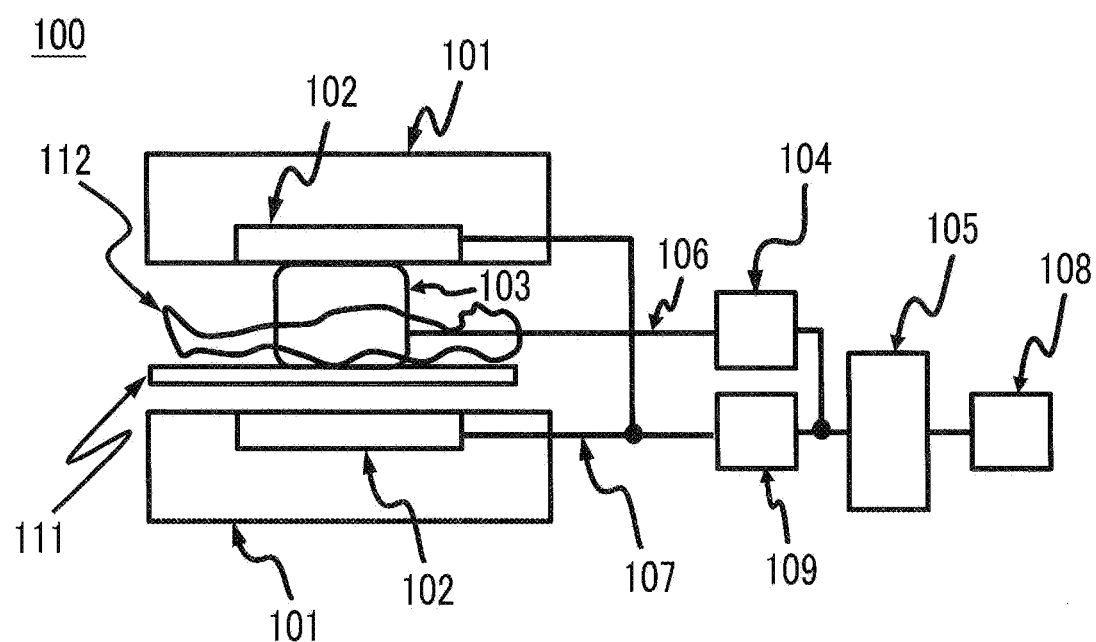
FIG. 1 is a schematic configuration diagram of an MM apparatus.

A schematic configuration diagram of an MRI apparatus 100 is shown in FIG. 1. The MRI apparatus 100 comprises a magnet 101 that forms a static magnetic field in a measurement space in which a subject 112 is disposed, a gradient magnetic field coil 102 that applies a magnetic field gradient in a predetermined direction to the static magnetic field, an RF antenna 103 that transmits a high-frequency signal (RF signal) to the subject 112 and receives a nuclear magnetic resonance signal (NMR signal) generated from the subject 112, a transmitter/receiver 104 that generates and transmits a pulse waveform of the RF signal (RF wave) to the RF antenna 103 and performs signal processing on the NMR signal received by the RF antenna 103, a gradient magnetic field power supply 109 that supplies a current to the gradient magnetic field coil 102, a data processing unit 105 that controls the drive of the transmitter/receiver 104 and the gradient magnetic field power supply 109 and accepts various types of information processing and an operation from an operator, a display device 108 for displaying a processing result of the data processing unit 105, and a bed 111 on which the subject 112 is placed.

The MRI apparatus 100 is classified into a horizontal magnetic field type and a vertical magnetic field type according to a direction of the static magnetic field formed by the magnet 101. In a horizontal magnetic field type MRI apparatus to which an RF coil unit according to the present embodiment is applied, the magnet 101 generally has a cylindrical bore (central space) and generates the static magnetic field in a left-right direction (a direction coinciding with a central axis of the RF coil unit) in FIG. 1, and the horizontal magnetic field type MRI apparatus is called a tunnel-type MRI apparatus.

Figure 2:
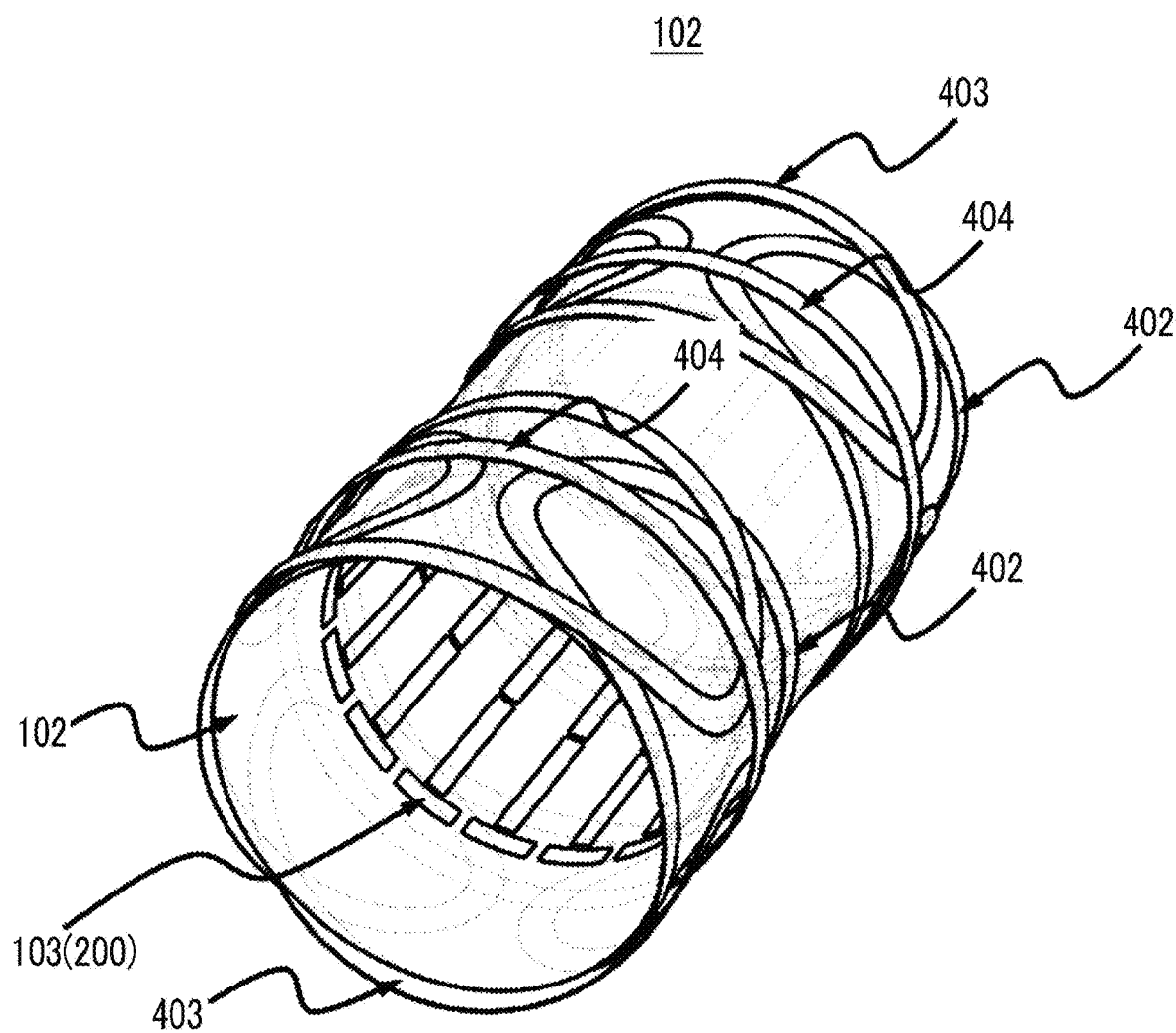
FIG. 2 is a perspective view showing a configuration of an irradiation coil and a gradient magnetic field coil.
Figure 2:
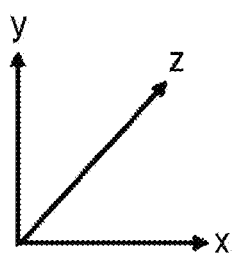

The gradient magnetic field coil 102 consists of three sets of coils that generate gradient magnetic fields in three axial directions orthogonal to each other, that is, X, Y, and Z, and in the above-described horizontal magnetic field type MRI apparatus, three sets of coils, that is, an X-coil 402, a Y-coil 403, and a Z-coil 404, are stacked with an insulating sheet in between and constructed in a cylindrical shape, as shown in FIG. 2. In many cases, among the three sets of coils, the X-coil 402 is disposed on the innermost side of the cylinder, and the Z-coil 404 is disposed on the outermost side of the cylinder.

The Z-coil 404 is a solenoid coil wound in a circumferential direction of the cylinder and generates a gradient magnetic field in an axial direction of the cylinder, and the Y-coil 403 and the X-coil 402 generate gradient magnetic fields in directions orthogonal to the axis, and each of the coils has a pair of coils disposed symmetrically with respect to the axial center of the cylinder, and the Y-coil 403 and the X-coil 402 are disposed at positions shifted by 90 degrees in the circumferential direction of the cylinder. In FIG. 2, the Y-coil 403 and the X-coil 402 are shown as simple loops for the sake of simplicity, but in reality, the Y-coil 403 and the X-coil 402 have complex patterns to generate predetermined gradient magnetic fields.

The RF antenna 103 is a birdcage-type transmission or transmission/reception antenna that resonates at a predetermined frequency and that has two channels, and is disposed inside the gradient magnetic field coil 102 described above. In a case where each part of a human body is imaged in detail, in most cases, a transmission antenna and a reception antenna are different to each other. In many cases, a large irradiation antenna installed inside the gradient magnetic field coil, which covers the entire body, is used for transmission, and a local antenna installed near the surface of the human body is used for reception. In this case, in most cases, the local antenna is dedicated to reception.

The gradient magnetic field power supply 109 and the gradient magnetic field coil 102 are connected by a gradient magnetic field control cable 107. In addition, the RF antenna 103 and the transmitter/receiver 104 are connected by a transmission/reception cable 106. The transmitter/receiver 104 comprises a synthesizer, a power amplifier, a reception mixer, an analog-digital converter, a transmission/reception changeover switch, and the like (all of which are not shown).

The data processing unit 105 controls the transmitter/receiver 104 and the gradient magnetic field power supply 109 to intermittently irradiate the subject 112 disposed in the static magnetic field with the RF signals from the RF antenna 103 and the gradient magnetic field coil 102, and applies the gradient magnetic fields. In addition, the NMR signal that is emitted from the subject 112 by resonating with the RF signal is received by the RF antenna 103, and is subjected to signal processing, thereby performing image reconstruction. The subject 112 is, for example, a predetermined part of the human body.

Configuration of RF Antenna

Hereinafter, the details of the RF antenna 103 applied to the MRI apparatus of the present embodiment will be described. The RF antenna 103 consists of a birdcage-type coil and an RF shield (hereinafter, abbreviated as a shield) disposed to encompass the birdcage-type coil.

Figure 3:
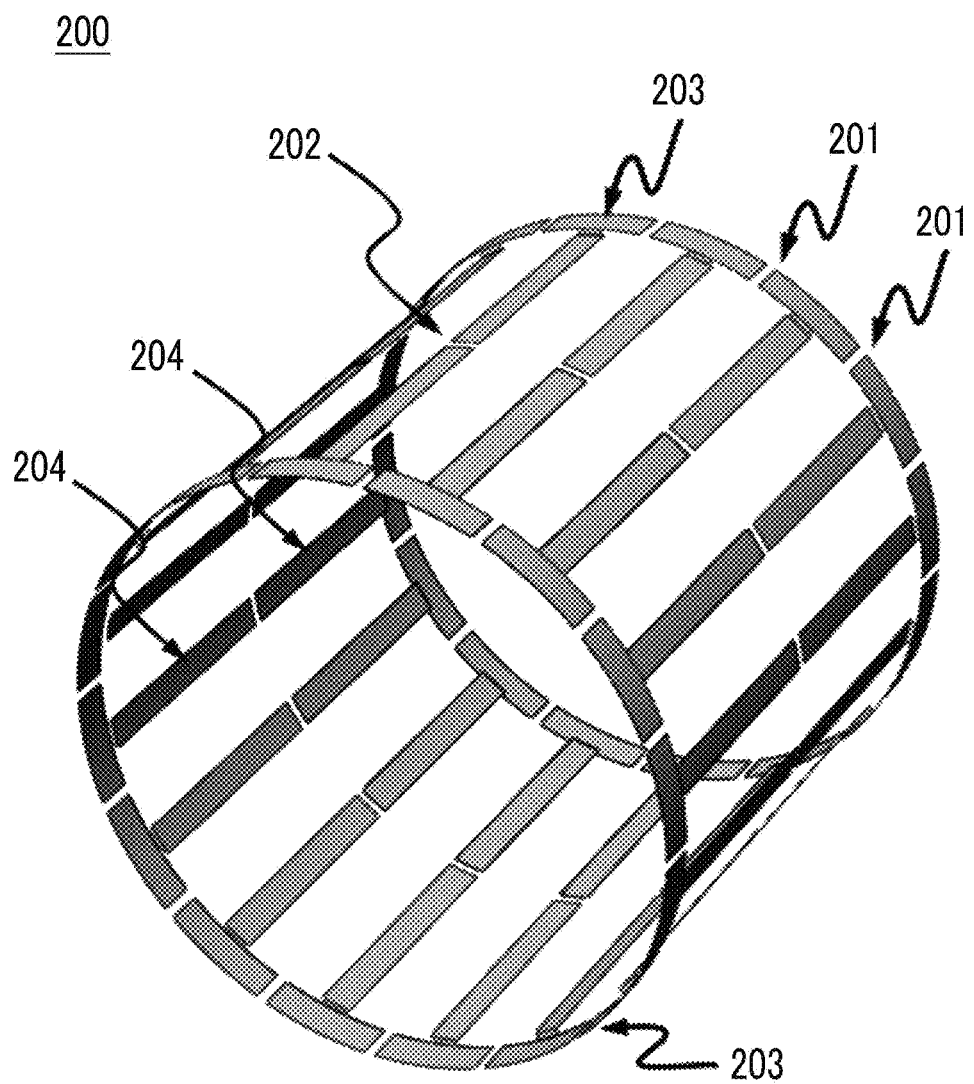
FIG. 3 is a perspective view of a birdcage-type irradiation coil.

As shown in FIG. 3, a birdcage-type coil 200 includes two circular ring-shaped ring conductors 203, a plurality of linear rung conductors 204, a capacitor, a diode, a power feeding cable (not shown), and the like. The central axis of each of the ring conductors 203, which are disposed at both ends of the RF coil to form end-rings, and the central axis of a cylindrical surface on which the rung conductors 204 are disposed are disposed to coincide with each other. The ring conductors 203 each have gaps 201 provided at equal intervals in the circumferential direction, the rung conductors 204 are disposed at equal intervals along the cylindrical surface on which the rung conductors are disposed, and both end parts of the rung conductor 204 are connected to a portion (on a front side) of the ring conductor 203 separated by the gap 201 and a portion (on a rear side) of the ring conductor 203 separated by the gap 201, respectively.

In the birdcage-type coil 200, the capacitors are inserted into the gaps 201 provided at equal intervals in each of the ring conductors 203 to connect the portions of the ring conductor, which are separated by the gap 201, and the diode is inserted into a gap 202 of the rung conductor 204 to connect the portions of the rung conductor, which are separated by the gap 202. The capacitor is adjusted by the ring conductor 203, the rung conductor 204, and the RF shield to resonate at the frequency of the high-frequency signal or the nuclear magnetic resonance signal.

The specifications of the birdcage-type coil 200 are not particularly limited; however, as an example, it is a birdcage-type coil called a high-pass type, with a diameter of about 710 mm and a total length of about 550 mm, in which capacitors are installed only in the ring conductor portion. The number of rung conductors is 24, and the diode is installed in a central notch of each rung conductor. During the time when the RF signal is not emitted, a reverse bias is applied to the diode to prevent coil resonance, in order to prevent coupling with the reception coil. This birdcage-type coil can be used in a 1.5 Tesla tunnel-type MRI apparatus, and in a case where the value of the capacitors installed at 24 locations in each of the ring conductors disposed at both ends of the cylinder is assumed to be about 200 pF, the coil resonates at 63.8 MHz, which is the RF resonance frequency of the 1.5 Tesla MRI apparatus.

Figure 4:
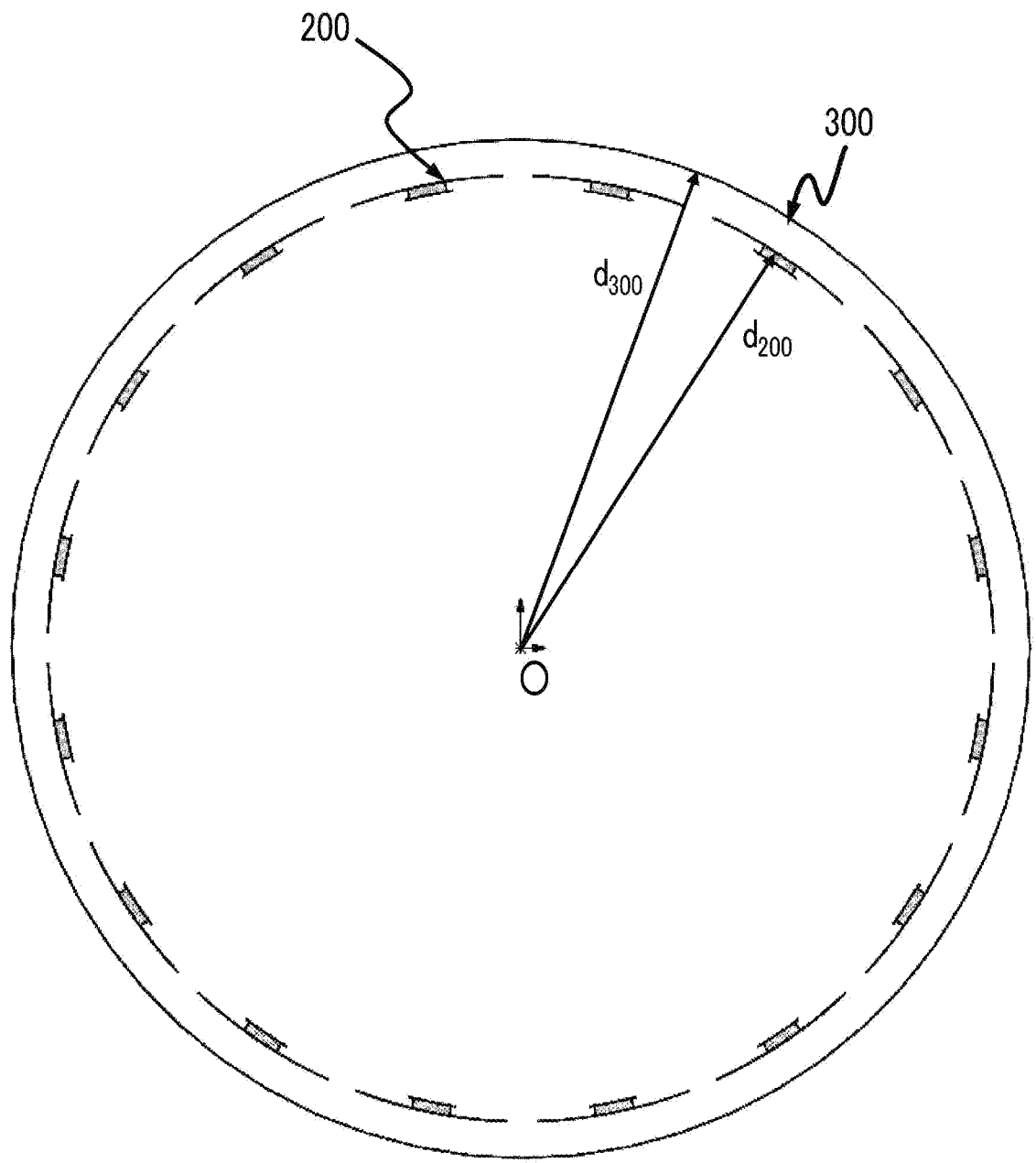
FIG. 4 is a schematic cross-sectional view of the birdcage-type irradiation coil and an RF shield.

FIG. 4 shows a cross-section of the RF antenna 103 using the birdcage-type coil 200 cut along a plane perpendicular to the cylinder axis. As shown in FIG. 4, an RF shield 300 is disposed to encompass the outer periphery of the birdcage-type coil 200, and the birdcage-type coil 200 and the RF shield 300 constitute the high-frequency coil unit, that is, the RF antenna 103. The RF shield 300 is composed of a cylindrical cylinder made of a conductor and may be sometimes attached to an inner surface of the gradient magnetic field coil.

The RF shield 300 is formed by partially peeling conductive thin films formed on both front and back surfaces of the insulating sheet through etching or the like to form a pattern, rolling the sheet around the cylinder axis after the pattern formation, and partially connecting the sheet to form a cylindrical shape. In the RF shield 300 having such a structure, the front and back conductive thin films function as the capacitor. The thicknesses of the insulating sheet and the conductive thin film are determined in consideration of the function of the RF shield as the capacitor and the mechanical strength. Specifically, the thickness of the insulating sheet is related to the capacitance of the capacitor formed by the front and back conductors, and a thinner sheet results in increased capacitance and reduced RF resistance, but an excessively thin sheet may become structurally weak, which increases the risk of damage such as hole formation. In addition, increasing the thickness of the conductive thin film can reduce RF resistance, but a thicker film increases an eddy current caused by the gradient magnetic field. Therefore, it is preferable to maintain a thinner thickness within a range in which the RF resistance does not increase.

As an example, a case is considered where the conductive material on the front and back sides is set to 18 microns thick copper, and the insulating sheet in between is set to 100 microns thick FR-4 (glass epoxy). The thickness of copper is set to 18 microns as an example; however, a thickness greater than the skin thickness at the RF frequency (about 64 MHz for a 1.5 Tesla MRI apparatus) is preferable because an increase in RF resistance can be prevented. The skin thickness is a length defined by Equation.

$$\delta = 1/\sqrt{\pi f \mu_r \mu_0 \sigma}$$

f represents a frequency, $\mu_r$ represents a relative magnetic permeability, $\mu_0$ represents a vacuum magnetic permeability, and $\sigma$ is an electrical conductivity.

In a case of a copper thin film having a frequency of 64 MHz, the skin thickness is about 8.2 microns, and in a case that the thin film thickness is 18 microns, it can be said that there is almost no reduction in electrical conductivity at the RF frequency due to the thinness.

The distance between the ring conductor of the birdcage-type coil 200 and the RF shield 300, that is, the difference (d300−d200) between a radius d300 of the RF shield and a radius d200 of the ring conductor of the birdcage-type coil 200, is an important design parameter that significantly affects the irradiation efficiency of the high-frequency coil unit. Therefore, the RF shield 300 is manufactured such that determining the size of the RF shield 300 and this difference are appropriate.

Figure 5:
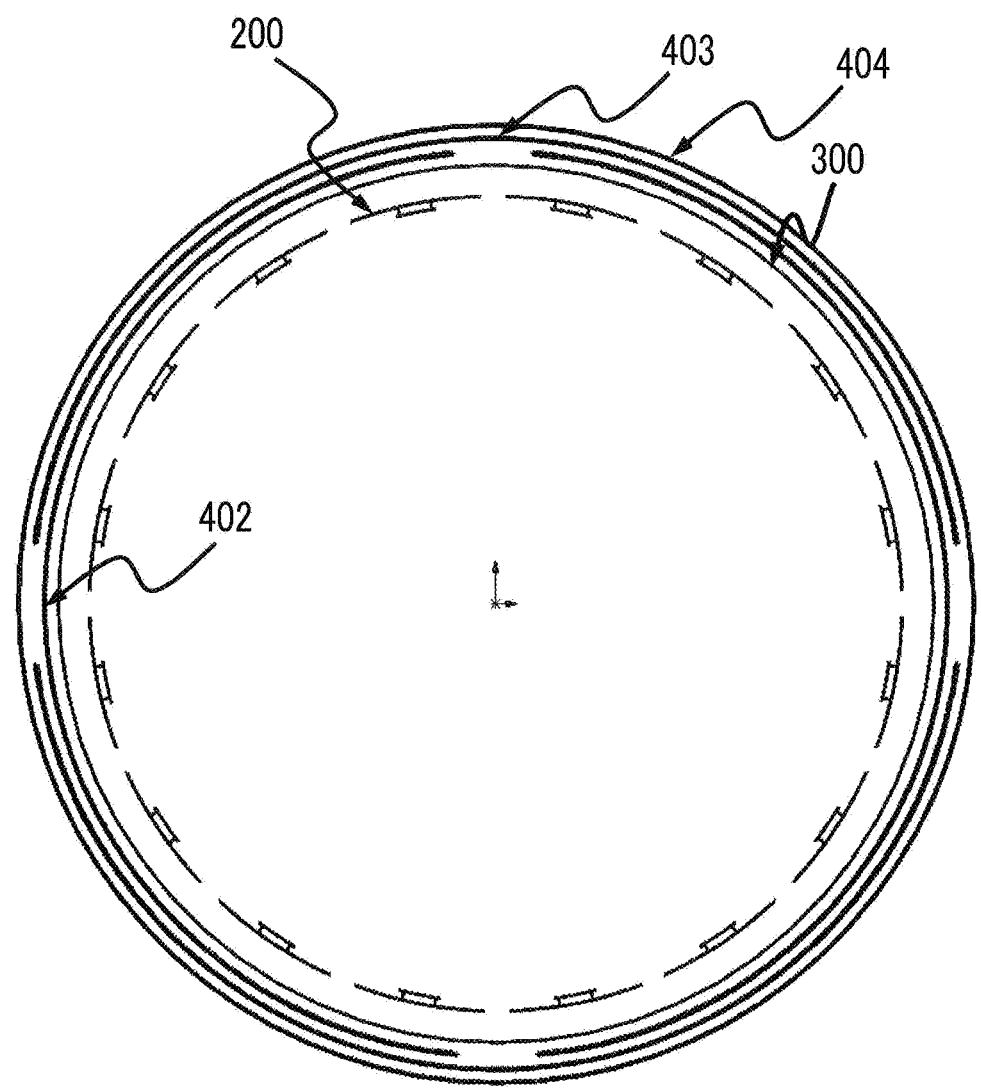
FIG. 5 is a schematic cross-sectional view of the irradiation coil and the gradient magnetic field coil.

In the positional relationship of the gradient magnetic field coil 102 (402 to 404), the X-coil 402 is located at the position closest to the RF shield 300 as shown in FIG. 5, because the X-coil 402 is disposed at the most inner inside the cylinder as shown in FIG. 2. FIG. 5 is a diagram showing a state in which the gradient magnetic field coil and the RF coil are cut along a cross-section perpendicular to the cylinder axis plane. In the RF shield 300, it is important to suppress the eddy current generated by the current flowing through the gradient magnetic field coil 102, and it is particularly important to take measures against the eddy current caused by the closest X-coil 402.

That is, as described above, the main requirements that the RF shield should meet are (1) having a high electrical conductivity at the RF frequency, for example, about 64 MHz for a 1.5 Tesla MM apparatus, and (2) ensuring that, within the frequency region of DC to several kHz emitted by the gradient magnetic field coil, the RF shield does not excessively generate heat or become prone to ignition due to an induced eddy current caused by the magnetic field generated by the gradient magnetic field coil. The RF shield of the present embodiment has the following configurations.

In order to meet the above-described requirements (1) and (2), the RF shield of the present embodiment is configured as follows. That is, both surfaces are formed of copper foil sheets and have patterns consisting of strips whose longitudinal directions are the axial direction of the cylinder, and the strips of the front and back patterns overlap in a staggered manner at both end regions of the cylinder, and the front and back strips overlap at the central region without being staggered from each other. In addition, the portions on both-end regions, which are close to the ring conductors of the birdcage-type coil, have patterns in which the strips (conductor portions) are connected. Further, a cut portion (a portion where the conductor is interrupted: a discontinuous portion) is provided at at least one location in the circumferential direction and is configured to be connected by the front and back capacitors with a wide area. A portion (central region) close to the rung conductors of the birdcage-type coil also has a cut portion at at least one location in the cylinder axis direction and is configured to be connected by the front and back capacitors with a wide area.

The width of the connecting portion is determined based on the eddy current that may occur in the connecting portion and a current that flows through the ring conductor of the RF coil. In addition, the both-end regions and the central region need only have at least one cut portion, and it is desirable that the number of cut portions is small in order to ensure the area of the capacitors.

Because the RF shield of the present embodiment has a structure of strip-shaped patterns having slits and the pattern is arranged in the both-end regions where the eddy current is strong, heat generation due to the eddy current can be suppressed. In addition, the each portion close to the ring conductor and the portion close to the rung conductors of the birdcage-type coil are configured to be connected by the front and back capacitors with a wide area, so that an RF coil unit with nearly no resistance near the magnetic resonance frequency (for example, 64 MHz), with an excellent irradiation efficiency, and with an excellent durability can be provided.

Hereinafter, the pattern of the RF shield of the present embodiment will be described with reference to specific examples.

Example 1

Figure 6A:
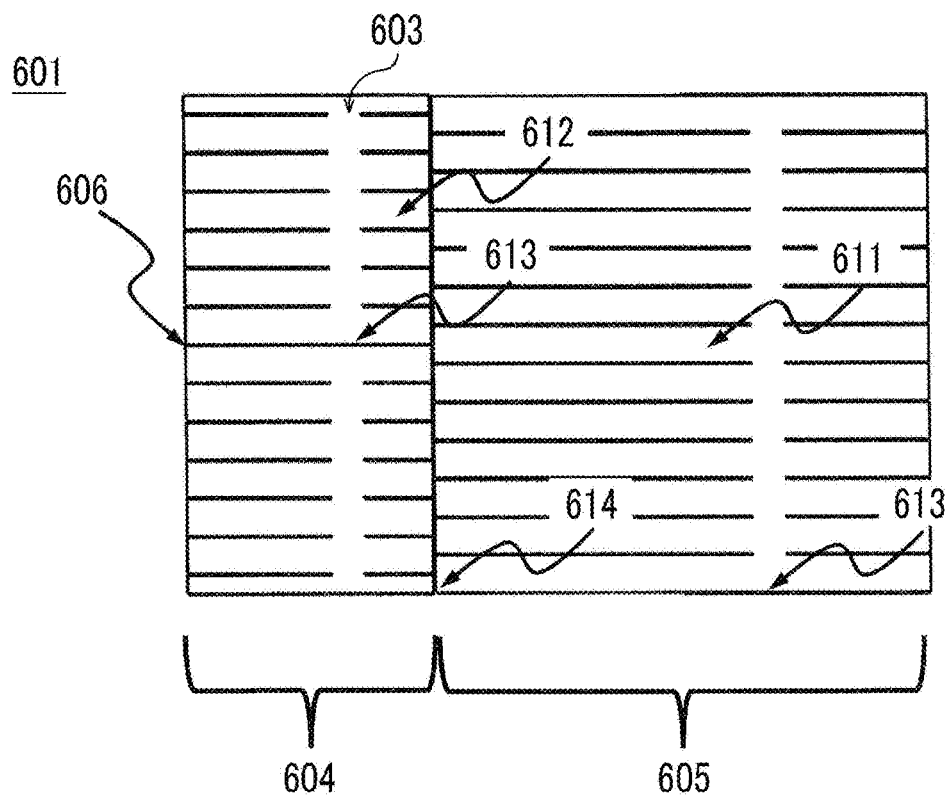
FIGS. 6A and 6B are diagrams illustrating an RF shield pattern (Example 1) of an RF coil unit of an embodiment of the present invention.
Figure 6B:
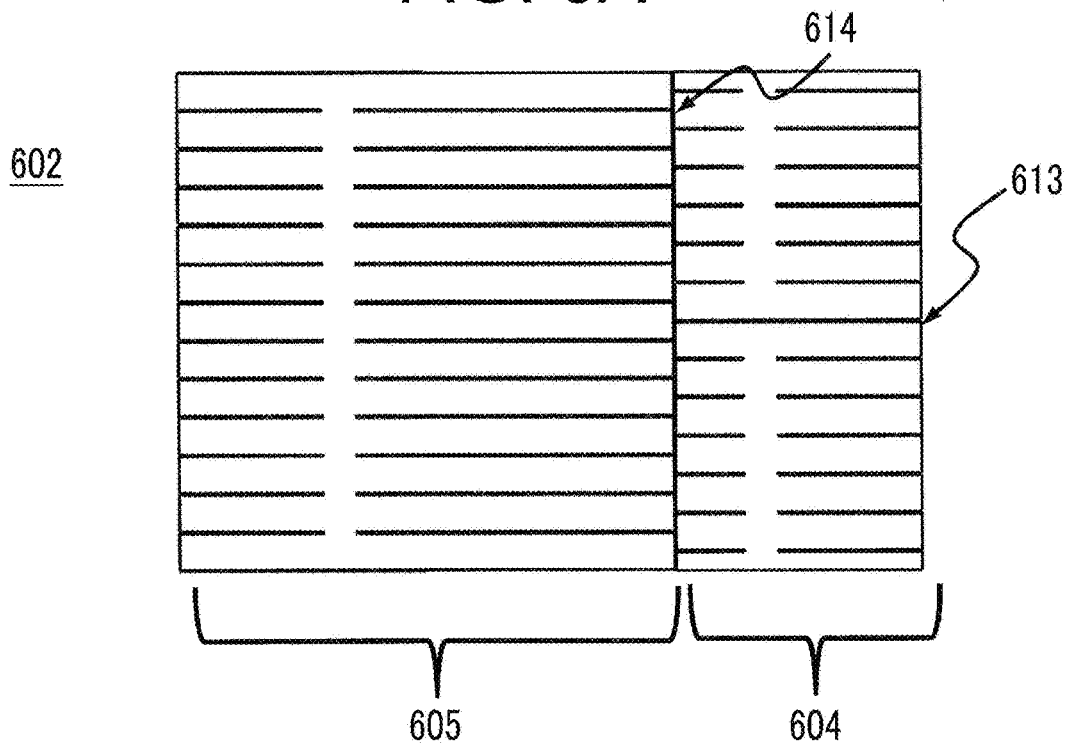

The conductive thin film pattern of the RF shield 300 of Example 1 will be described with reference to FIGS. 6A, 6B, and 7. FIGS. 6A and 6B are diagrams showing a state in which the cylindrical RF shield 300 is unrolled in the circumferential direction, and FIG. 6A shows a pattern (hereinafter, referred to as a front pattern) 601 on the front side (the outer peripheral surface of the cylinder), and FIG. 6B shows a pattern (hereinafter, referred to as a back pattern) 602 on the back side (the inner peripheral surface of the cylinder). That is, the horizontal direction of FIGS. 6A and 6B is the axial direction of the cylinder, and each the front pattern 601 and the back pattern 602, which are shown, form a cylindrical shape by connecting the upper end and the lower end. However, the patterns shown in FIGS. 6A and 6B are different from the actual scale of the RF shield for the sake of description.

As shown in the drawings, in the cylindrical RF shield 300, the front pattern 601 and the back pattern 602 are symmetrical in the left-right direction, with the central axis direction of the cylinder as the left-right direction. Hereinafter, details of the front pattern will be described as a representative.

The front pattern 601 is divided into two: left and right regions (conductor regions) 604 and 605 by a cut portion 614 along the circumferential direction, and the left-side region 604 is further divided into upper and lower portions by a cut portion 613 along the axial direction at a position 606. The left and right regions preferably have sizes such that the length in the cylinder axis direction of the smaller region 604, from the circumferential connection portion to the end part nearer to the magnetic field center direction, (that is, a difference between a width 704 and [a half of the width of a center portion 715] shown in FIG. 7) is less than half a length (an interval between the ring conductors) of the birdcage-type coil 200 in the cylinder axis direction. And the length in the cylinder axis direction of the region 604 is at least three times the width in the cylinder axis direction of the ring conductor of the birdcage-type coil 200.

The front pattern divided by the two cut portions in this way is divided into a total of three regions (hereinafter, also referred to as islands). The region 605 is longer in the left-right direction than the region 604. Therefore, the cut portion 614 of the front and back sides is shifted in the axial direction of the cylinder.

Each island has slits 611 and 612 from the left and right sides such that strips are formed, but the left and right slits are not connected, and each of the strips has a connecting portion 603 connecting in the up-down direction at one location. It is preferable that the position (axial position) of the portion 603 where the strip is connected in the up-down direction is located in the vicinity of the ring conductor of the birdcage-type coil, that is, the distance 704 (FIG. 7) from the center of the pattern is half the interval between the ring conductors, and it is desirable that the width (axial length) of the connection is wide within a range in which heat generation due to the eddy current is allowed. Further, the width of the strips in the circumferential direction (the up-down direction in the drawing) is the same for both the regions 604 and 605, but the one of them is formed with a half-width shift relative to the other. In the shown example, the widths of the strips at the upper end and the lower end of the region 604 have half-width.

The back pattern 602 is a left-right reversed pattern of the front pattern 601 as described above. These front and back patterns are formed into a sheet shape and then rolled into a cylindrical shape, and the end parts are electrically connected through partial soldering, or the like. In this case, the upper edge and the lower edge in the left-side region 604 are electrically connected. As a result, the pattern of the left-side region 604 rolled into a cylindrical shape becomes a single region, with the position 606 as the cut portion and the rest being electrically connected. On the other hand, in the right-side region, the upper edge and the lower edge are not electrically connected by providing a gap of approximately 1 millimeter. Similarly, on the back surface, the region 604 is electrically connected, but the region 605 is not electrically connected when rolled.

Figure 7:
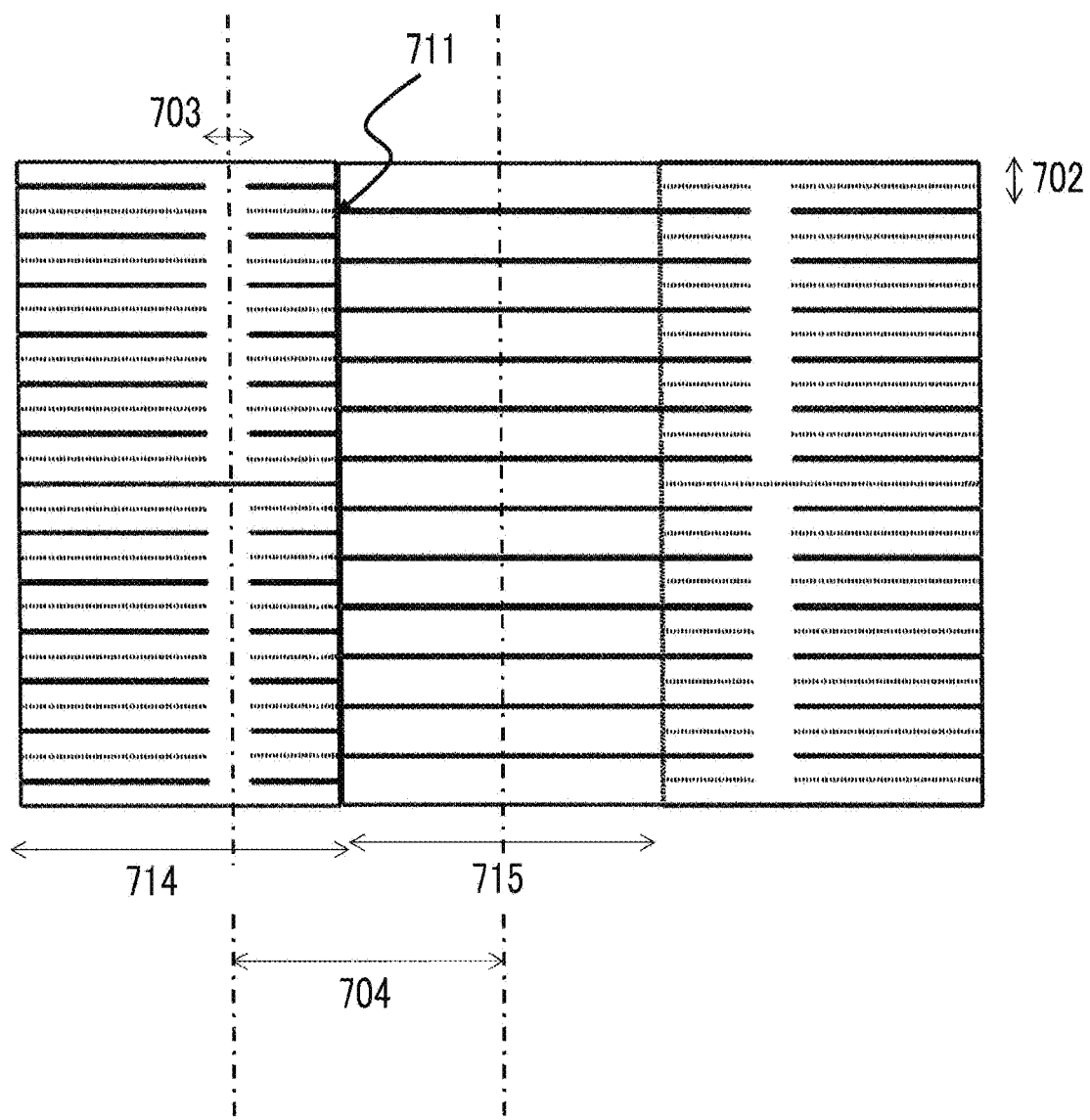
FIG. 7 is a diagram in which front and back surfaces of the RF shield patterns of FIGS. 6A and 6B are combined.

FIG. 7 shows a state in which such a front pattern and a back pattern are overlaid. In FIG. 7, thick lines indicate the front pattern and thin lines indicate the back pattern. As shown in the drawing, in the overlay of the strip-shaped front and back patterns, in a left-side portion 714 where the region 604 of the front pattern 601 overlaps with the region 605 of the back pattern 602, and a right-side portion 714 where the region 605 of the front pattern 601 overlaps with the region 604 of the back pattern 602, the arrangement of the strips in the region 604 and the region 605 is shifted by a half the width. Therefore, the front and back strips are overlaid in a staggered manner. On the other hand, in the central portion (center portion) 715 where the region 605 of the front pattern 601 and the region 605 of the back pattern 602 overlap, the slits coincide with each other, and the strips are overlaid without being staggered.

As a result, because the strips are staggered in the left and right portions 714, it makes possible that foils of front and back make capacitive connection and the birdcage-type coil ring current to the circumferential direction flows effectively. And further, the circumferential direction connection of the front and back copper foils in a portion 703 enables current flow in the circumferential direction without interruption. On the other hand, in the center portion 715, the rung conductors of the birdcage-type coil 200 are disposed, and no current is generated in the circumferential direction, so that there is no need for staggering in this portion, and there is an advantage in not staggering because the overlapping area between individual strips on the front and back sides increases.

The effect of the RF shield of the present embodiment will be described in comparison with the thin film pattern of the RF shield of the prior art shown in FIGS. 9A and 9B.

Figure 9A:
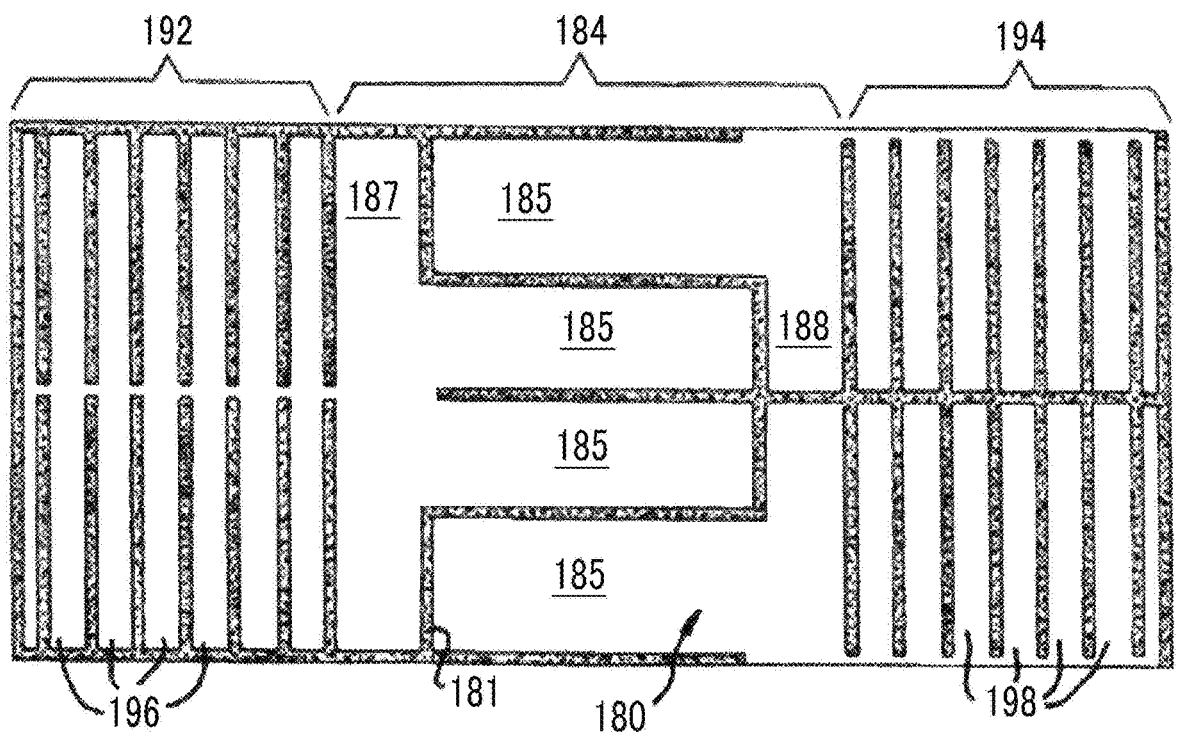
FIGS. 9A and 9B are diagrams showing an RF shield pattern of the prior art.
Figure 9B:
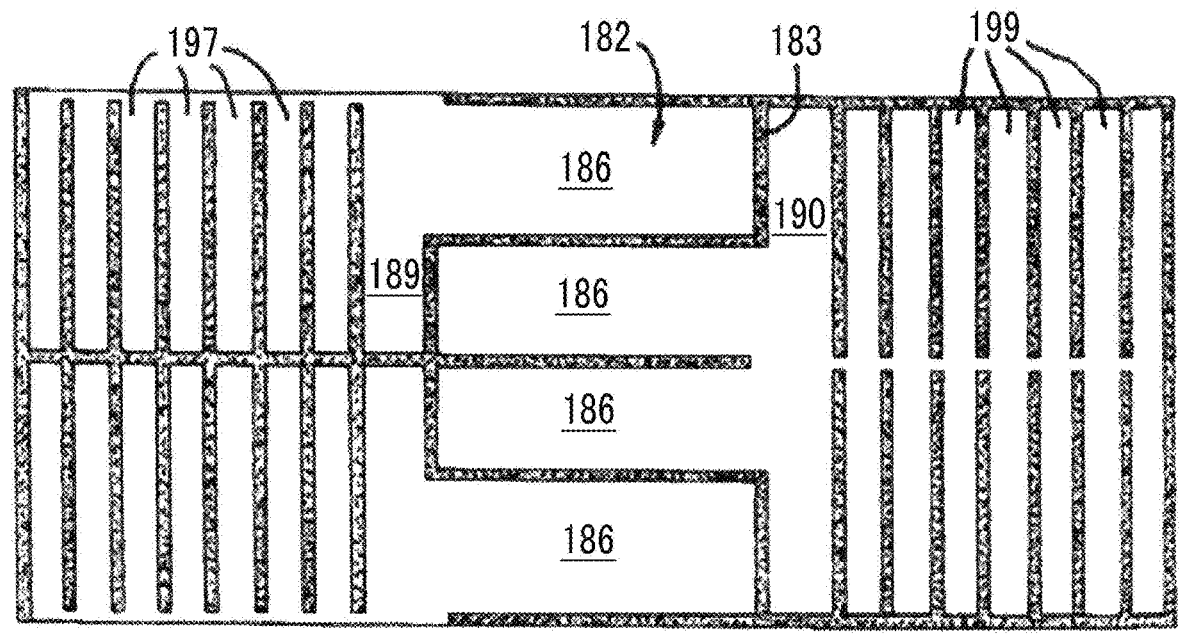

As shown in FIGS. 9A and 9B, the thin film pattern of the RF shield of the prior art is common to that of the RF shield of the present embodiment in the aspects that the strips (tiles) are provided. And it is also common in that the patterns are varied between the left and right portions and the central portion in the axial direction for both the front and back surfaces, corresponding respectively to the ring conductor and the rung conductors of the birdcage-type coil.

However, in the thin film pattern of the prior art, the longitudinal direction of the strip in the center portion is the axial direction and the longitudinal direction in both end is the circumferential direction. Whereas in the present embodiment, the longitudinal direction of the strip is all the axial direction. In addition, in the pattern of the prior art, since the widths of the strips are different in each location, the eddy current caused by the gradient magnetic field is also generated non-uniformly, which makes it difficult to predict the heat generation distribution. On the other hand, in the pattern of the RF shield of the present embodiment, since the widths of the strips are equal everywhere, heat generation due to the eddy current occurs mainly according to the strength of the magnetic field generated by the gradient magnetic field coil, which provides an advantage in terms of easier prediction and countermeasures.

Figure 8:
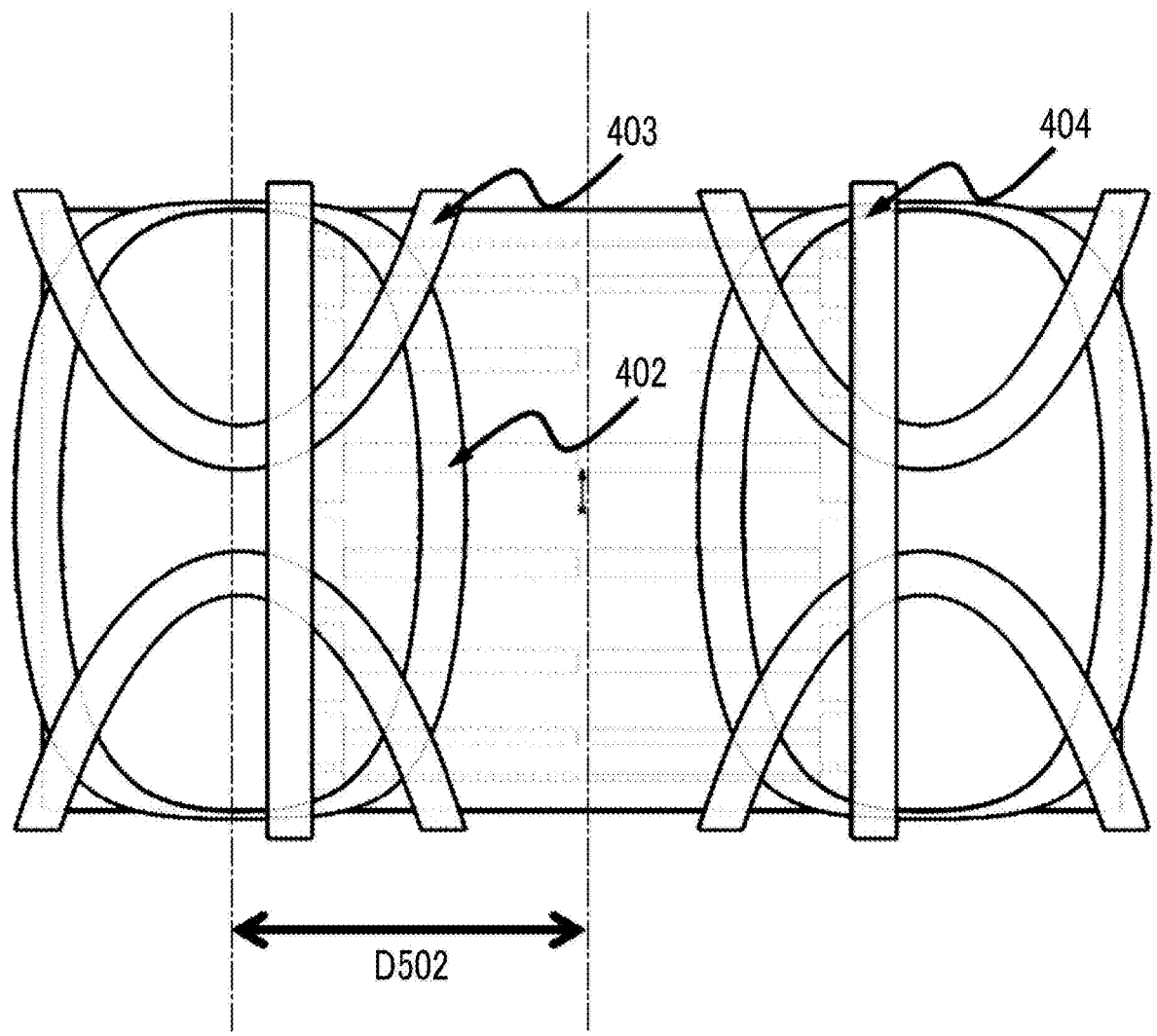
FIG. 8 is a diagram of a configuration of the gradient magnetic field coil viewed from the right.
Figure 10:
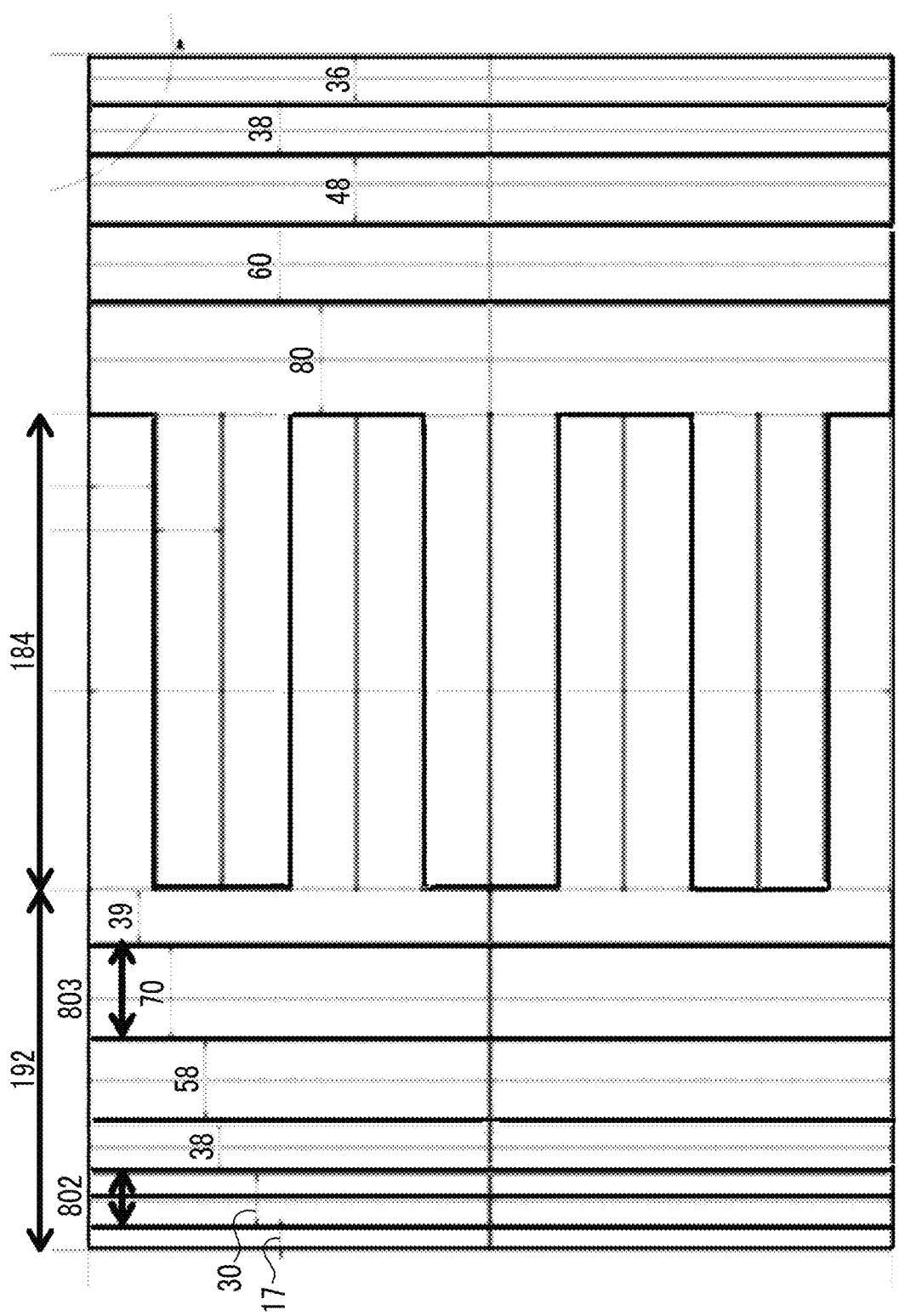
FIG. 10 is an example of an actual design pattern diagram using the prior art.

Further, as shown in FIG. 8, in the cylindrical gradient magnetic field coil, a point where the gradient magnetic field in the X- or Y-direction is strongest is located at a distance D502 away from the center, so that it is necessary to determine the width of the strips at this portion to prevent excessive eddy current generation. For this reason, in the RF shield of the prior art, as shown in FIG. 10, it is desirable that the widths of the strips at both ends are narrower on a side 802 close to the end part and wider on a side 803 close to the ring conductor to maximize the overlapping area of the front and back patterns, that is, a design of gradually changing the width is required. Further, since strips are formed in the circumferential direction in this portion, the overlapping area of the front and back surfaces is W×L/2 in a case that the width of the strips is denoted by W and the length of one circumference of the cylinder is denoted by L.

On the other hand, in the RF shield of the present embodiment, only one width needs to be determined such that the excessive eddy current generation is prevented at the location of the distance D502, and only one width for the strips is sufficient. Further, in the front and back patterns of this portion (the position of the distance D502), since the strips are connected in the circumferential direction, the overlapping area is V×L in a case that the width of the region 604, that is, the length of the portion 714, is denoted by V. The length V of the portion 714 can be approximately seven times the width (702) W of the strips in this example, and the overlapping area V×L of the strips is about 14 times larger than the overlapping area W×L/2 in the prior art. That is, the capacitance of the capacitor composed of the front and back patterns increases by 14 times, and the impedance component of the capacitor becomes 1/14. This significantly contributes to the improvement of electrical conductivity (reduction in complex impedance) at the above-described RF frequency.

Further, regarding a point where a plurality of strips is adjacent to each other, in the present example, for example, on a single surface, three strip corners from only one side of the front and back surfaces can come together at a point 711 shown in FIG. 7 because the strips of the two regions 604 and 605 are alternately arranged. However, in the conventional technology, the patterns of the both-side regions 192 and 194 in the cylinder axis direction have many points where four strip corners from only one side of the front and back surfaces come together. According to electromagnetic field simulations, it is understood that in a case that there is a point where many corners of the strips come together where a relatively large portion of mirror currents of the birdcage-type coil flow, significant RF currents may flow locally to generate heat, and the RF local currents are predicted to be several times larger at the point where four strips come together than at the point where three strips come together. Therefore, the configuration of the present example has a high efficiency to suppress heat generation due to the RF local current as compared to that of the pattern of the conventional technology.

As described above, using the RF shield of the present embodiment, the front and back thin film patterns are configured such that (1) two divided regions having different lengths in the axial direction are formed and the strips whose longitudinal directions are the axial direction of the cylinder are formed in each of the regions, and (2) the portions where the strips are connected in the circumferential direction are provided at both-end sides of the cylinder, whereby it is possible to obtain an effect of improving the electrical conductivity at the RF frequency and maintaining a high irradiation efficiency of the coil while suppressing the generation of the eddy current caused by the gradient magnetic field and the heat generation due to the eddy current. Further, using the RF shield of the present embodiment, by making a capacitor area formed by aligning the front and back strips wider on both-end sides in the axial direction of the cylinder where the gradient magnetic field intensity is high, it is possible to improve the electrical conductivity at the RF frequency and maintain a high irradiation efficiency of the coil.

Example 2

In the thin film pattern of the RF shield of the present example, similarly to the pattern of the RF shield of Example 1, the strips are divided in the cylinder axis direction and also divided in the circumferential direction at one location on each of the front and back surfaces. In Example 1, the strips are formed with a half-width shift in the two regions divided in the cylinder axis direction, but in the present embodiment, there is no shift in the width direction (circumferential direction) of the strips in the two regions. Instead, the difference lies in the fact that the strips are shifted by half the width in the circumferential direction between the front pattern and the back pattern.

Figure 11A:
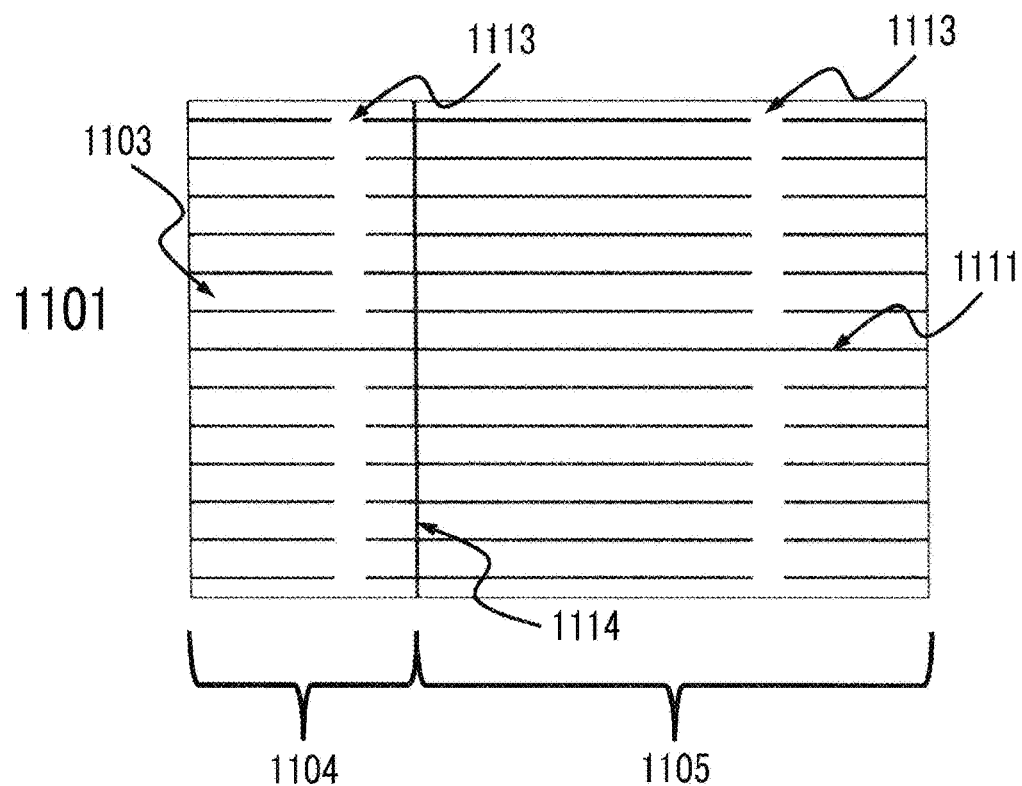
FIGS. 11A and 11B are diagrams illustrating an RF shield pattern (Example 2) of an RF coil unit of an embodiment of the present invention.
Figure 11B:
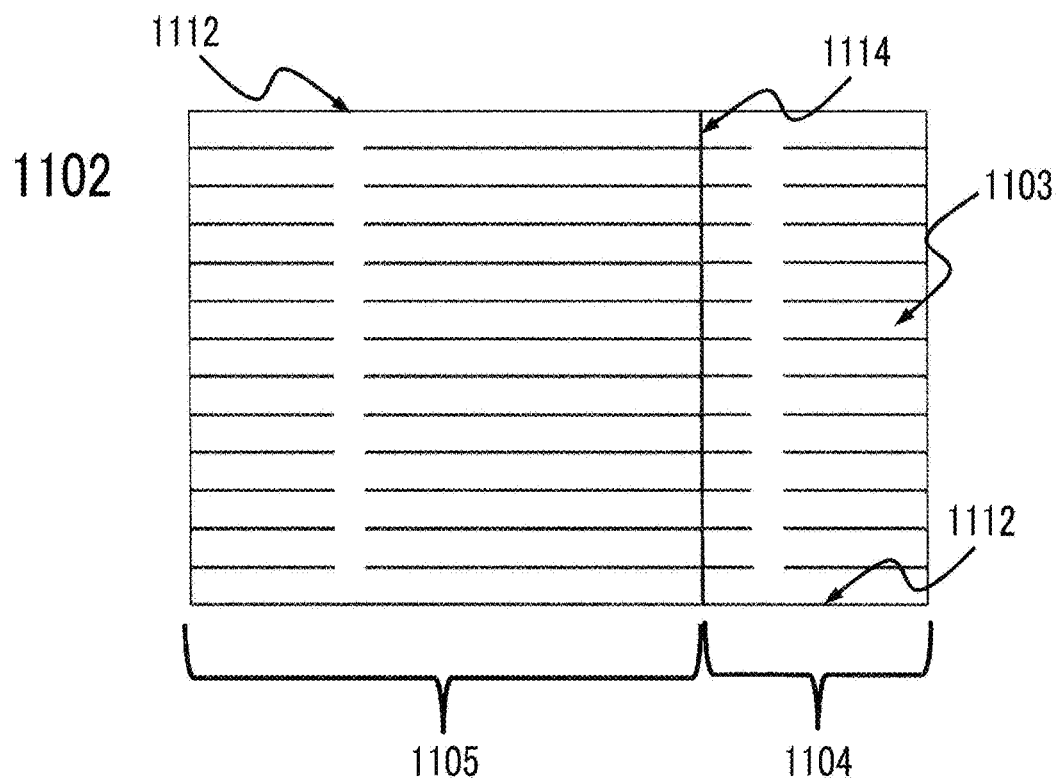
Figure 12:
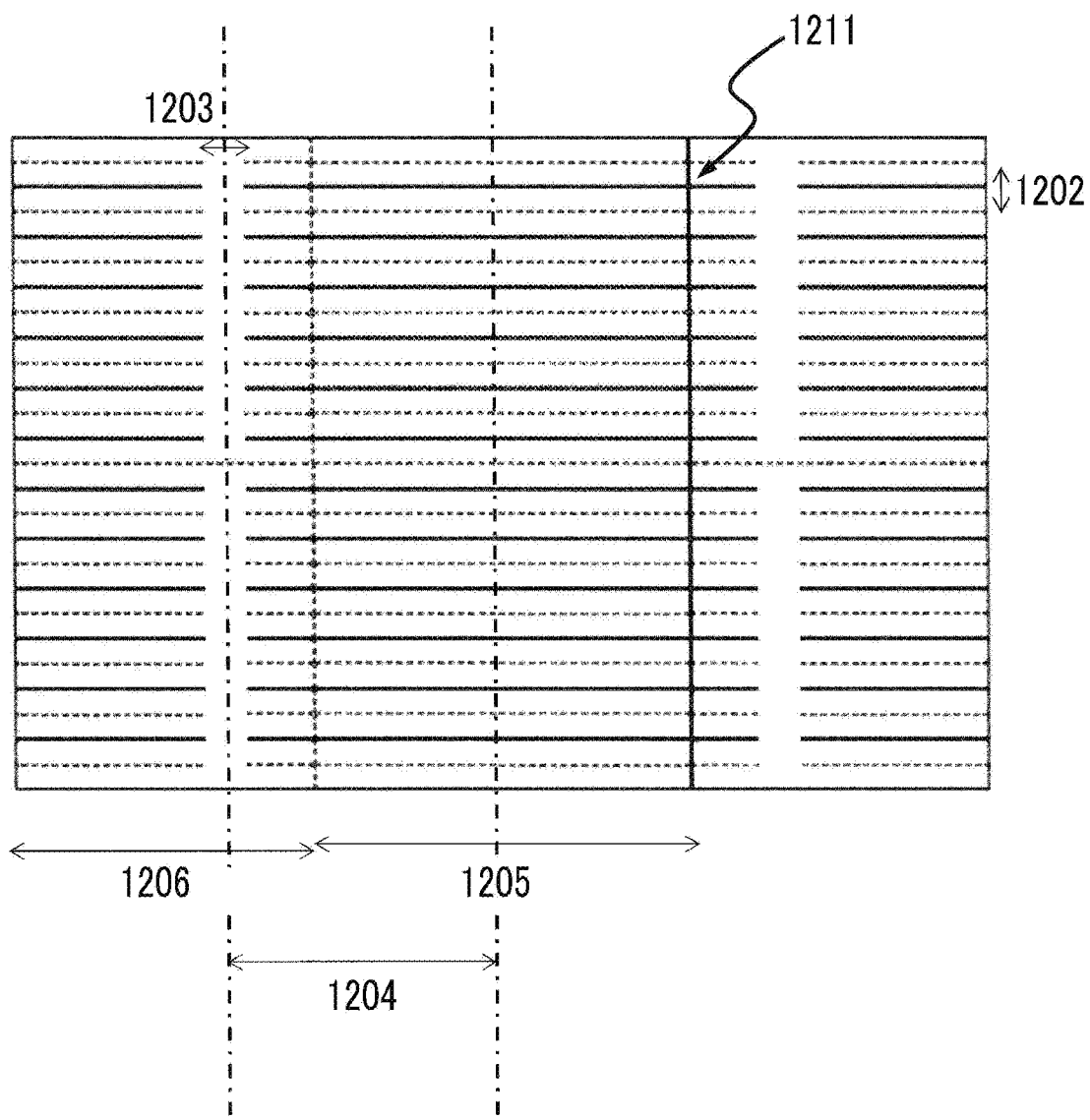
FIG. 12 is a diagram in which front and back surfaces of the RF shield patterns of FIGS. 11A and 11B are combined.

Hereinafter, the thin film pattern of the RF shield of the present example will be described with reference to FIGS. 11A, 11B, and 12. FIGS. 11A and 11B are diagrams showing a front pattern 1101 and a back pattern 1102 and show a state in which the cylindrical RF shield is unrolled in the circumferential direction with the axis of the cylinder as same as in FIGS. 6A and 6B. Further, FIG. 12 shows a state in which the front pattern 1101 and the back pattern 1102 are overlapped, and the back pattern is indicated by dotted lines.

The front pattern 1101 is divided into two regions 1104 and 1105 in the cylinder axis direction by cutting the pattern at a cut portion 1114. The region 1105 includes the center in the axial direction and is longer than the region 1104. Further, the front pattern 1101 is divided into four regions (islands) in an unrolled state by cutting the pattern at a cut portion 1111. Each region has slits 1103 such that strips are formed from the cylinder axis direction, and each of the strips has portions connected in the circumferential direction at two locations (positions indicated by 1113). Further, the widths of the strips at the upper end and the lower end are each half the width (the length in the circumferential direction) of the other strips.

When such a front pattern 1101 is rolled into a cylindrical shape, strips with half the width are electrically connected. An end part 1112 is a cut portion where the conductor connection is interrupted.

The back pattern 1102 is also divided in the axial direction of the cylinder at the cut portion 1114. The position of the cut portion 1114 has a left-right symmetrical relationship with the position of the cut portion 1114 of the front pattern. The back pattern 1102 does not have the cut portion (the cut portion 1111 of the front pattern) at which the pattern is cut along the cylinder axis direction. As a result, the back pattern 1102 is divided into two islands. Similar to the front pattern 1101, the back pattern 1102 also has slits such that the strips are formed along the cylinder axis direction, and each of the strips has portions connected in the circumferential direction at two locations (positions indicated by 1113). The widths of all the strips are the same as the width of the strips except the width of the upper and lower strips of the front pattern 1101.

When such a back pattern 1102 is rolled into a cylindrical shape, the upper and lower strips are not electrically connected.

In a state in which the front and back surfaces of these patterns are integrated, as shown in FIG. 12, the strips are disposed in the same manner as in Example 1 on the end-portion sides where the intensity of the gradient magnetic field coil is high, and the generation of the eddy current can be limited as in Example 1. In addition, since the pattern is continuous along the current flowing through the ring conductor of the birdcage-type coil at the position 1113, that is, the current flowing in the circumferential direction, the electrical conductivity at the RF frequency is improved, and a high irradiation efficiency of the coil can be maintained. That is, the same effect as that of Example 1 can be obtained even with the pattern of the present example.

Regarding a point where a plurality of strips come together, in Example 1, there is a point where a maximum of three strip corners come together from only one side of the front and back surfaces when looking at the pattern on one surface, whereas in the present example, for example, at a point 1211 or the like, four strip corners come together from only one side of the front and back surfaces. Therefore, in a case that these points are located in a portion where mirror currents of the birdcage-type coil are significant, there is a probability that significant RF currents may flow locally. However, by adjusting the position of the cut portion 1114, this situation can be avoided.

In addition, in the thin film pattern of the present example, since only one of the two front and back patterns need only be electrically connected in the up-down direction when the patterns are rolled into a cylindrical shape, the RF shield can be easily manufactured as compared with the thin film pattern of Example 1 in which electrical connection portions are provided on both the front and back surfaces. For example, only the inner pattern, which is easier to perform connection work, is disposed as the front pattern shown in FIG. 11A to form the front and back patterns into a sheet shape, and then the back pattern is disposed on the outside and rolled into a cylindrical shape, and in this state, electrical connection need only be performed from the inside, so that workability is improved.

As described above, the RF shield of the embodiment of the present invention has a feature that the strips, whose longitudinal directions are the cylinder axis direction, are formed and that, on at least both sides of the cylinder, the front and back strips overlap in a staggered manner and portions, where the strips are connected, are provided, whereby it is possible to suppress the generation of the eddy current caused by the gradient magnetic field and the heat generation due to the eddy current. This feature improves the electrical conductivity at the RF frequency and maintains a high irradiation efficiency of the RF coil. Such an RF shield of the embodiment of the present invention has a simple pattern, unlike the conventional technology, there is no need to consider various different lengths for determining the width of the strips, and only the length (703) of the portion (connection portion) where the strips are connected and the width W (702) of the strips need to be mainly determined, so that the design is simplified.

EXPLANATION OF REFERENCES

100: MRI apparatus
101: magnet
102: gradient magnetic field coil
103: RF antenna
104: transmitter/receiver
105: data processing unit
106: transmission/reception cable
107: gradient magnetic field control cable
108: display device
109: gradient magnetic field power supply
111: bed
112: subject
200: birdcage-type coil
203: ring conductor
204: rung conductor
300: RF shield
402, 403, 404: gradient magnetic field coil
601, 602: RF shield pattern (front and back)
1101, 1102: RF shield pattern (front and back)

What is claimed is:

1. A high-frequency coil unit comprising:
a cylindrical RF coil including ring conductors disposed at both ends and a plurality of rung conductors connecting the ring conductors provided at both ends; and
a cylindrical RF shield disposed to cover an outer periphery of the RF coil,
wherein the RF shield includes an insulating sheet and conductor patterns formed on a front surface and a back surface of the insulating sheet, the conductor patterns are each divided into first and second conductor regions with different sizes in an axial direction of a cylinder, each of the conductor regions includes a plurality of strips that have a connection portion which is provided at at least one location in the axial direction of the cylinder and which extends along a circumferential direction of the cylinder and that are partially separated by a plurality of slits partially formed along the axial direction of the cylinder, the connection portion along the circumferential direction of the cylinder is cut at at least one location within one circumference of the cylinder, and a position of a cut portion thereof is shifted in the circumferential direction in the conductor pattern of the front surface and the conductor pattern of the back surface, and
the conductor pattern of the front surface and the conductor pattern of the back surface are disposed such that the first conductor region of one and the second conductor region of the other overlap, and the slit of the conductor pattern of the front surface and the slit of the conductor pattern of the back surface are shifted from each other in the circumferential direction in an overlapping portion between the first conductor region and the second conductor region.

2. The high-frequency coil unit according to claim 1, wherein the plurality of slits each have a discontinuous portion partially in the axial direction, and adjacent strips are connected through the discontinuous portion.

3. The high-frequency coil unit according to claim 2, wherein the discontinuous portion is formed at a position overlapping with the ring conductor of the RF coil.

4. The high-frequency coil unit according to claim 2, wherein a width of the discontinuous portion is determined based on an eddy current that occurs in the discontinuous portion and a current flowing through the ring conductor of the RF coil.

5. The high-frequency coil unit according to claim 1, wherein, among the first and second conductor regions, a width, from a magnetic field center-side end part to the connection portion along the circumferential direction, of a smaller conductor region is less than half a length of the RF coil in a cylinder axis direction, and a width of the smaller conductor region in the cylinder axis direction is at least three times a width of the ring conductor of the RF coil in the cylinder axis direction.

6. The high-frequency coil unit according to claim 1, wherein the plurality of slits formed in the first conductor region and the plurality of slits formed in the second conductor region each have the same slit interval, and the slit of the first conductor region and the slit of the second conductor region are formed in a staggered manner.

7. The high-frequency coil unit according to claim 1,
wherein the plurality of slits formed in the first conductor region and the plurality of slits formed in the second conductor region each have the same slit interval, and
the conductor pattern of the front surface and the conductor pattern of the back surface are disposed such that the slits formed in the first and second conductor regions of one conductor pattern and the slits formed in the first and second conductor regions of the other conductor pattern are formed in a staggered manner.

8. A magnetic resonance imaging apparatus comprising:
the high-frequency coil unit according to claim 1.

9. The magnetic resonance imaging apparatus according to claim 8,
wherein the high-frequency coil unit is an irradiation coil.

* * * * *